United States Patent
Wu

(10) Patent No.: US 7,912,172 B2
(45) Date of Patent: Mar. 22, 2011

(54) PROGRAMMABLE DIVIDER APPARATUS AND METHOD FOR THE SAME

(75) Inventor: Han-Hau Wu, Taipei (TW)

(73) Assignee: Richwave Technology Corp., Taipei (TW)

( * ) Notice: Subject to any disclaimer, the term of this patent is extended or adjusted under 35 U.S.C. 154(b) by 36 days.

(21) Appl. No.: 12/480,106

(22) Filed: Jun. 8, 2009

(65) Prior Publication Data

US 2009/0322386 A1    Dec. 31, 2009

(30) Foreign Application Priority Data

Jun. 25, 2008  (TW) ................................ 97123661 A

(51) Int. Cl.
*H03K 21/00* (2006.01)
(52) U.S. Cl. ............................................ 377/47; 377/48
(58) Field of Classification Search .................... 377/47, 377/48; 327/115, 117
See application file for complete search history.

(56) References Cited

U.S. PATENT DOCUMENTS

| | | | | |
|---|---|---|---|---|
| 6,163,182 A | * | 12/2000 | Canard et al. | 327/117 |
| 7,180,341 B2 | * | 2/2007 | Harada et al. | 327/117 |
| 7,595,668 B2 | * | 9/2009 | Cheung | 327/117 |
| 2010/0085085 A1 | * | 4/2010 | Yang | 327/117 |

* cited by examiner

*Primary Examiner* — Tuan Lam
(74) *Attorney, Agent, or Firm* — Chun-Ming Shih; HDLS IPR Services

(57) ABSTRACT

A programmable divider apparatus comprises a first divider, a second divider, a feedback control unit, and a plurality of control signals. The first divider provides a frequency division operation of division by at least three integers, the second divider is cascaded to the first divider to provide a frequency division operation of division by two integers. The feedback control unit is coupled to between the first divider and the second divider to provide a feedback control signal to selectively supply an output of the second divider to an input of the first divider. The apparatus control signals and the feedback control signal are used to execute the first divider or the second divider.

14 Claims, 11 Drawing Sheets

PROGRAMMABLE DIVIDER APPARATUS AND METHOD FOR THE SAME

BACKGROUND OF THE INVENTION

1. Field of the Invention

The present invention relates to a programmable divider apparatus, and more particularly to a programmable divider apparatus that can selectively supply a feedback control.

2. Description of Prior Art

Reference is made to FIG. 1 which is a block diagram of a prior art frequency synthesizer. The frequency synthesizer 30 comprises a phase/frequency detector 300, a loop filter 302, a voltage-controlled oscillator 304, a frequency divider 306, and a programmable frequency divider 308.

The phase/frequency detector 300 compares a difference between a reference input frequency (Fref) and a feedback frequency outputted from the frequency divider 306, and outputs an output signal corresponding to phase difference and frequency difference for these two signals. The output signal is processed by the loop filter 302, and the processed output signal is coupled to the voltage-controlled oscillator 304. The voltage-controlled oscillator feedback frequency (Fvco) will be utilized to lock the reference input frequency (Fref) by frequency divider 306. The phase and frequency of the frequency synthesizer 30 are locked when the phase and frequency of the frequency divider output frequency (Fdiv) and the phase and frequency of the voltage-controlled oscillator feedback frequency (Fvco) are synchronous.

The frequency divider 306 can perform frequency division for the voltage-controlled oscillator 304 such that the reference input frequency (Fref) can be locked by the frequency synthesizer 30. Moreover, the output of the voltage-controlled oscillator 304 equals M multiplies Fref (M×Fref) when the divisor of the divider 306 equals M. Hence, the divisor M of the frequency divider 306 can be adjusted to produce an output frequency Fdiv based on the voltage-controlled oscillator feedback frequency (Fvco). If a divisor of the programmable frequency divider 308 equals P, an output frequency (Fout) of the frequency synthesizer 30 is repressed by:

$$Fout=(M/P)\times Fref$$

Hence, by setting parameters M and P for a frequency divider are designed to produce various frequency source according to a reference frequency Fref. A frequency synthesizer can function as a clock generator or frequency source and is developed for application elements in the clock circuit. FIG. 2 is a block diagram of an application for a frequency synthesizer 30, which is applied to a reception circuit for a mobile phone. In conclusion, the adjustable divisor of the programmable frequency divider is an important component in a phase-lock-loop circuit. Hence, the phase-lock-loop circuit has a more versatile function if a programmable multi-divisor frequency divider can be implemented in a simplified way.

SUMMARY OF THE INVENTION

Accordingly, a primary object of the present invention is to provide a programmable divider apparatus that can selectively supply a feedback control to accomplish multi-divisor frequency division operation.

In order to achieve the objective mentioned above, the present invention provides a preferred embodiment of a programmable divider apparatus. The frequency division apparatus comprises a first divider providing a frequency division operation of division by at least three consecutive integers; a second divider providing a frequency division operation of division by 2 and 3, and is cascaded to the first divider; a feedback control unit coupled to between an output of the second divider and an input of the first divider; a plurality of control signals control the first divider to execute a frequency division operation of division by at least three consecutive integers, and to control the second divider to execute a frequency division operation of division by 2 and 3, and to control the feedback control unit selectively to provide the output of the second divider to the first divider. The at least three consecutive integers can be N, N+1, . . . , N+n, and N; and n are integers greater than 2 so as to provide a frequency division operation of division by 2N to (3N+3n).

The present invention provides another programmable divider apparatus that can receive an input signal to execute a frequency division operation of division by 4, 5, . . . , and 12. The frequency division apparatus comprises a first divider to provide a frequency division operation of division by 2, 3, and 4; a second divider to provide a frequency division operation of division by 2 and 3, and cascaded to the first divider; and a feedback control unit coupled to between an output of the second divider and an input of the first divider. The first divider and the second divider can selectively set the divisor. The feedback control signal controls the feedback control unit to selectively provide the output of the second divider or provide a logic-high signal or a logic-low signal to the input of the first divider to execute a frequency division operation of division by 4, 5, . . . , and 12.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

Figure 1:
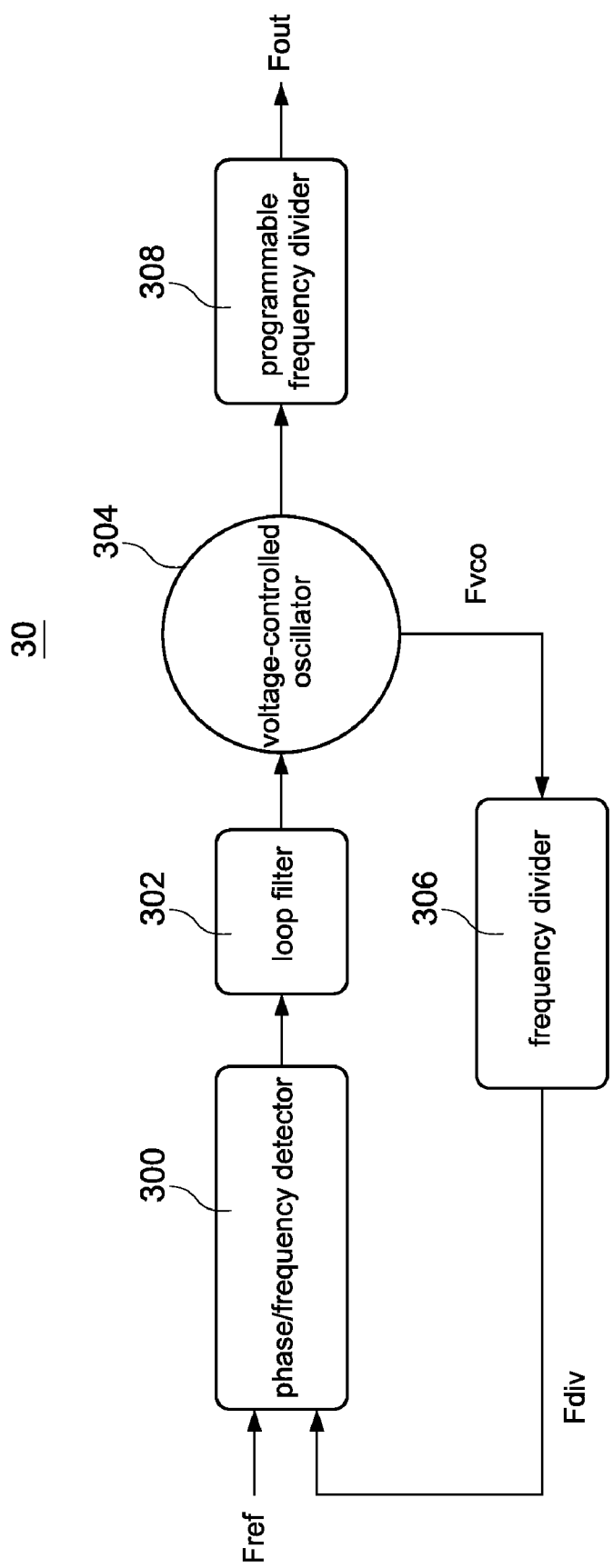
FIG. 1 is a block diagram of a prior art frequency synthesizer.
Figure 2:
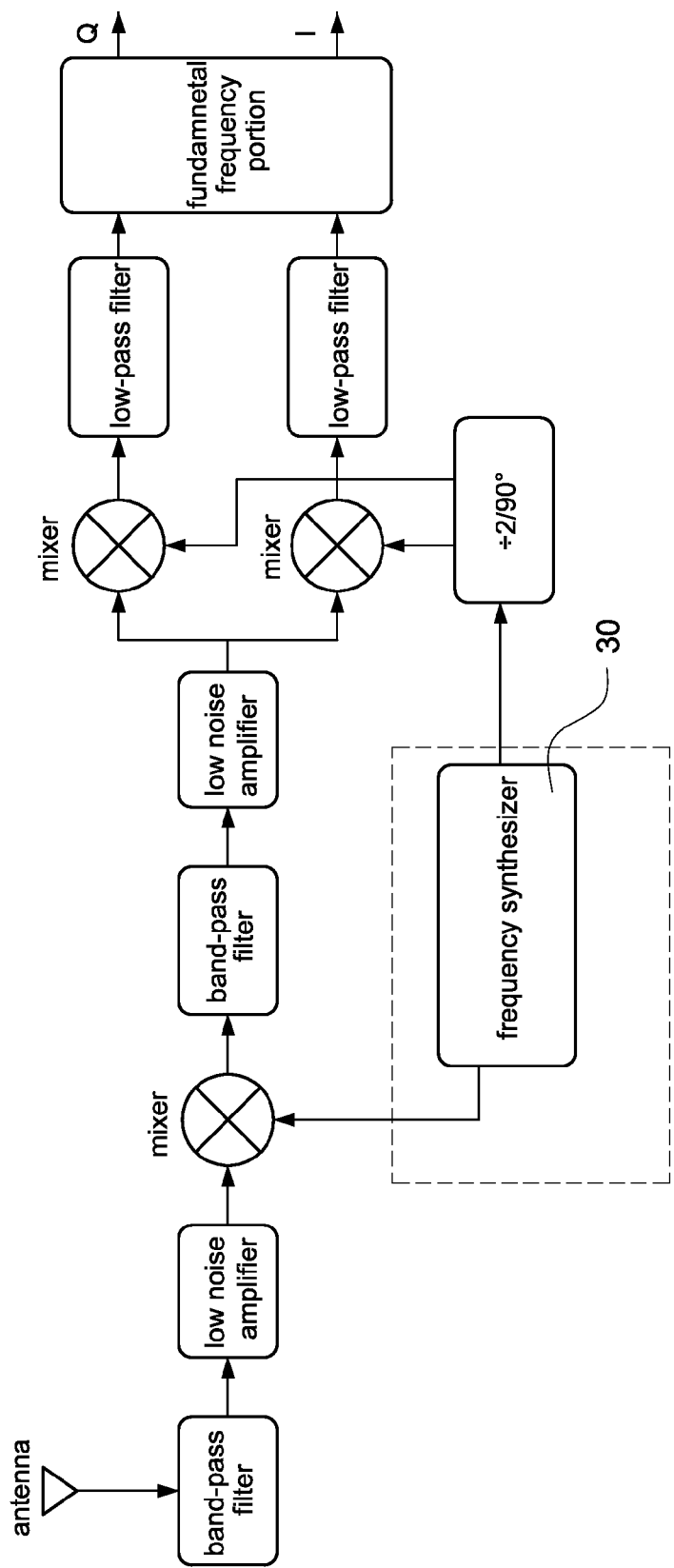
FIG. 2 is a block diagram of an application for the frequency synthesizer.

In cooperation with attached drawings, the technical contents and detailed description of the present invention are described thereinafter according to a preferable embodiment, being not used to limit its executing scope. Any equivalent variation and modification made according to appended claims is all covered by the claims claimed by the present invention.

Reference will now be made to the drawing figures to describe the present invention in detail.

Figure 3A:
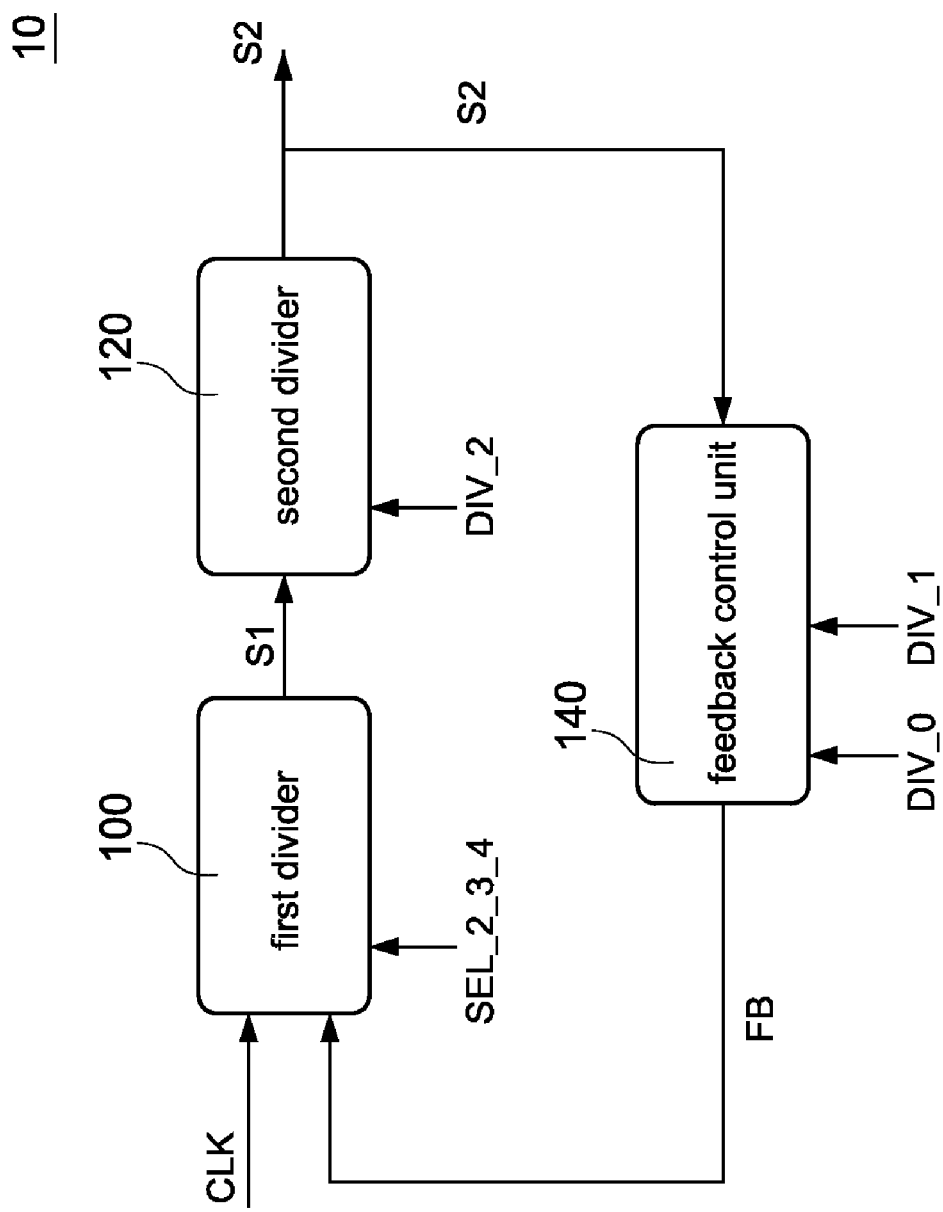
FIG. 3A is a block diagram of a preferred embodiment of a programmable divider apparatus according to the present invention.

Reference is made to FIG. 3A which is a block diagram of a preferred embodiment of a programmable divider apparatus 10 according to the present invention. The programmable divider apparatus 10 comprises a first divider 100, a second divider 120, and a feedback control unit 140. The second divider 120 is cascaded to the first divider 100. An input of the feedback control unit 140 is coupled to an output of the second divider 120, and an output of the feedback control unit 140 is coupled to an input of the first divider 100 to form a feedback control path. The other input of the first divider 100 receives an input signal (CLK).

The first divider 100 is a triple-division-ratio frequency divider and can be controlled by a first selection control signal (SEL_2_3_4) and a feedback output signal (FB) to provide three different divisors, such as 2, 3, and 4. The second divider 120 is a double-division-ratio divider and can be controlled by a second selection control signal (Div_2) to provide two different divisors, such as 2 and 3. The feedback control unit 140 is coupled to between the first divider 100 and the second divider 120, and is controlled by feedback control signals (Div_0, Div_1) to selectively close or open the feedback control path. The feedback control unit 140 outputs selectively a logic-high signal or a logic-low signal when the feedback control path opens.

Table 1 shows a relation between the output of the feedback control unit 140 and the feedback control signals (Div_0, Div_1):

TABLE 1

| Div_0 | Div_1 | output of the feedback control unit |
|---|---|---|
| 0 | 0 | 1 |
| 0 | 1 | 0 |
| 1 | 0 | FB (feedback signal) |

Figure 3B:
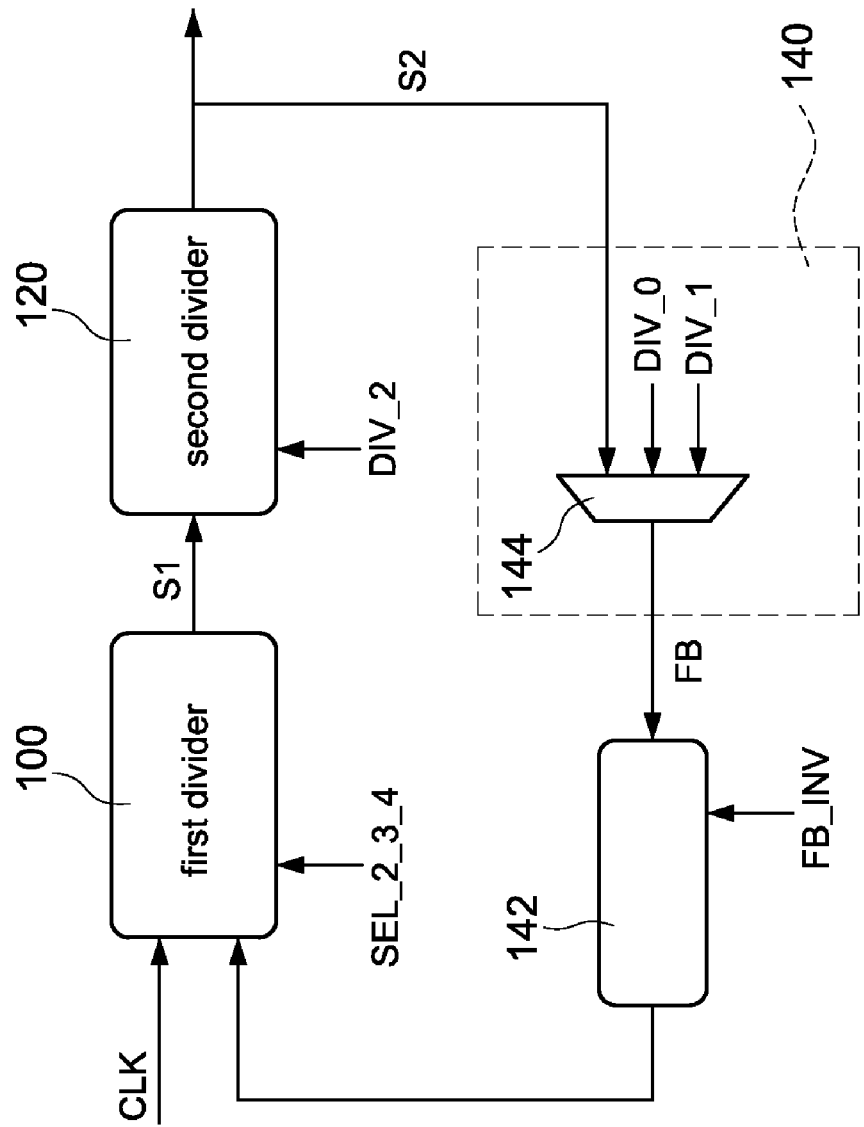
FIG. 3B is a block diagram of another preferred embodiment of the programmable divider apparatus according to the present invention.

Reference is made to FIG. 3B which is a block diagram of another preferred embodiment of the programmable divider apparatus according to the present invention. The programmable divider apparatus 10 further comprises a logic unit 142 to invert the feedback signal (FB). The logic unit 142 inverts the feedback signal (FB) produced from the feedback control unit 140 when a feedback inversion control signal (FB_inv) is sent to the logic unit 142. By inverting the feedback signal (FB) with the feedback inversion control signal (FB_inv), the division by 3 operation of first divider 100 can be changed to a division by 4 operation, and vice versa. Therefore, the programmable divider apparatus 10 can easily provide the operation of division by 11 without increasing complexity of the circuit.

In addition, the feedback control unit 140 of the programmable divider apparatus 10 further comprises a multiplexer 144. The multiplexer 144 is controlled by the feedback control signals (Div_0, Div_1) to provide selectively the output of the second divider 120 to the input of the first divider 100 or provide a logic-high signal or a logic-low signal.

Figure 4:
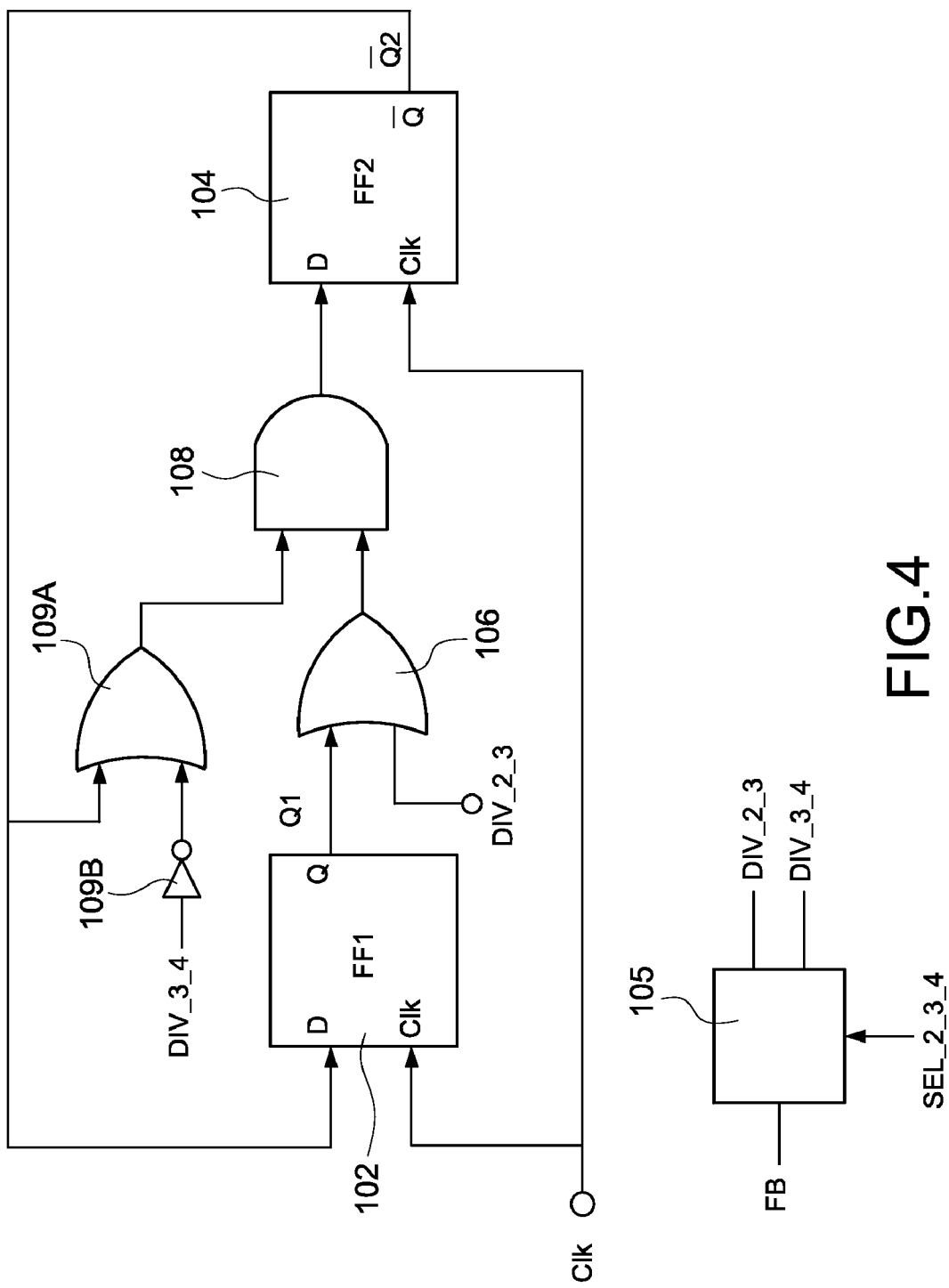
FIG. 4 is a circuit diagram of a first divider.

Reference is made to FIG. 4 which is a circuit diagram of a first divider 100. The first divider 100 comprises a first flip flop 102 (a D-type flip flop is shown), a second flip flop 104 (a D-type flip flop is shown), a first logic portion 106 (an OR gate is shown), a second logic portion 108 (an AND gate is shown), a third logic portion 109A (an OR gate is shown), and a fourth logic portion 109B (a NOT gate is shown). An output of the first flip flop 102 is coupled to an input of the OR gate 106, an output of the OR gate 106 is coupled to an input of the AND gate 108, and an output of the AND gate 108 is coupled to an input of the second flip flop 104. An output of the second flip flop 104 is fed back to an input of the first flip flop 102, and is fed back to the other input of the AND gate 108 via the OR gate 109A. In addition, the other input of the OR gate 106 is controlled by a first control signal (DIV_2_3).

The first divider 100 provides a frequency division operation of division by 2 when the first control signal (DIV_2_3) is logic 1, i.e., the input signal (CLK) is divided by 2; the first divider 100 provides a frequency division operation of division by 3 when the first control signal (DIV_2_3) is logic 0, i.e., the input signal (CLK) is divided by 3. The first divider 100 provides a frequency division operation of division by 4 when the first control signal (DIV_2_3) is logic 0 and a second control signal (DIV_3_4) is logic 0, i.e., a feedback path between the second flip flop 104 and the AND gate 108 is opened when the second control signal (DIV_3_4) is operated by the NOT gate 109B and the OR gate 109A. The first control signal (DIV_2_3) and the second control signal (DIV_3_4) can be controlled by the first selection control signal (SEL_2_3_4) and the feedback output signal (FB) to provide a frequency division operation of division by 2, 3, and 4. The feedback output signal (FB) is controlled by the first selection control signal (SEL_2_3_4) to operate a switching unit 105 to select whether the first control signal (DIV_2_3) or the second control signal (DIV_3_4) is outputted. When one of the first control signal (DIV_2_3) or the second control signal (DIV_3_4) is the feedback output signal (FB), the other one is a fixed-level signal, which is manifested by the following Table 2.

TABLE 2

| SEL_2_3_4 | DIV_2_3 | DIV_3_4 |
|---|---|---|
| 0 | fixed-level signal | FB (feedback signal) |
| 1 | FB (feedback signal) | fixed-level signal |

The first divider 100 and the second divider 120 are not limited those as shown in the figure and can be replaced or modified by other circuits. For example, the D-type flip flop can be replaced by a latch, SR-type, JK-type, or T-type flip flop. The OR gate 106, 106' can be replaced by a NOR gate and an inverter, or a NOT gate. The AND gate 108, 108' can be replaced by a NAND gate and an inverter, or a NOT gate. The logic levels of the first control signal (DIV_2_3) and the second control signal (DIV_3_4) are not limited to be logic 1 or logic 0 when controlling the first divider 100.

The programmable divider apparatus 10 can execute a frequency division operation of division by 4, 5, 6, . . . , 12 by exploiting the properties of the first divider 100 and the second divider 120. More particularly, the first divider 100 can provide a frequency division operation of division by three integers (namely, 2, 3, and 4), the second divider 120 can provide a frequency division operation of division by two integers (namely, 2 and 3), the feedback control unit 140 and the control signals (SEL_2_3_4, Div_2, Div_0, and Div_1) are used to control the first divider 100 and the second divider 120. The divisor (N) can be expressed in an addition operation with two or three operands. The combination of the operands is shown in table 3.

TABLE 3

| divisor (N) | combination of operands (A + B + C) |
|---|---|
| 4* | 2 + 2 |
| 5 | 2 + 3 |
| 6* | 3 + 3 |
| 7 | 3 + 4 |
| 8* | 4 + 4 |
| 9* | 3 + 3 + 3 |
| 10 | 3 + 3 + 4 |
| 11 | 4 + 4 + 3 |
| 12* | 4 + 4 + 4 |

The operation rules of the programmable divider apparatus 10 can be defined as following:

1. The divisor (N) marked with a star sign (*) contains repeated operands (namely A=B, or A=B=C in the parenthesis of above table) and can be obtained directly from the first divider 100 and the second divider 120 without the feedback control unit 104. On the contrary, the division (N) not marked with a star sign (*) needs the process provided by the feedback control unit 140

2. In table 3, with two operands (A and B) are required, the second divider 120 is controlled to execute a frequency division operation of division by 2 by the second selection control signal (Div_2). In this way, two operands (A and B) are selected ty synthesize the divisor (N). When three operands (A, B, and C) are required, the second divider 120 is controlled to excecute a frequency division operation of division by 3 by the second selection control signal (Div_2). In this way, three operands (A, B and C) are selected to synthesize the divisor (N).

3. The values of the operand A, the operand B, and the operand C are determined by the first divider 100.

References are made to FIG. 5A to FIG. 5D which are signal waveform charts of the programmable divider apparatus is applied to different divisors, such as 6, 7, 10, and 11, respectively.

Figure 5A:
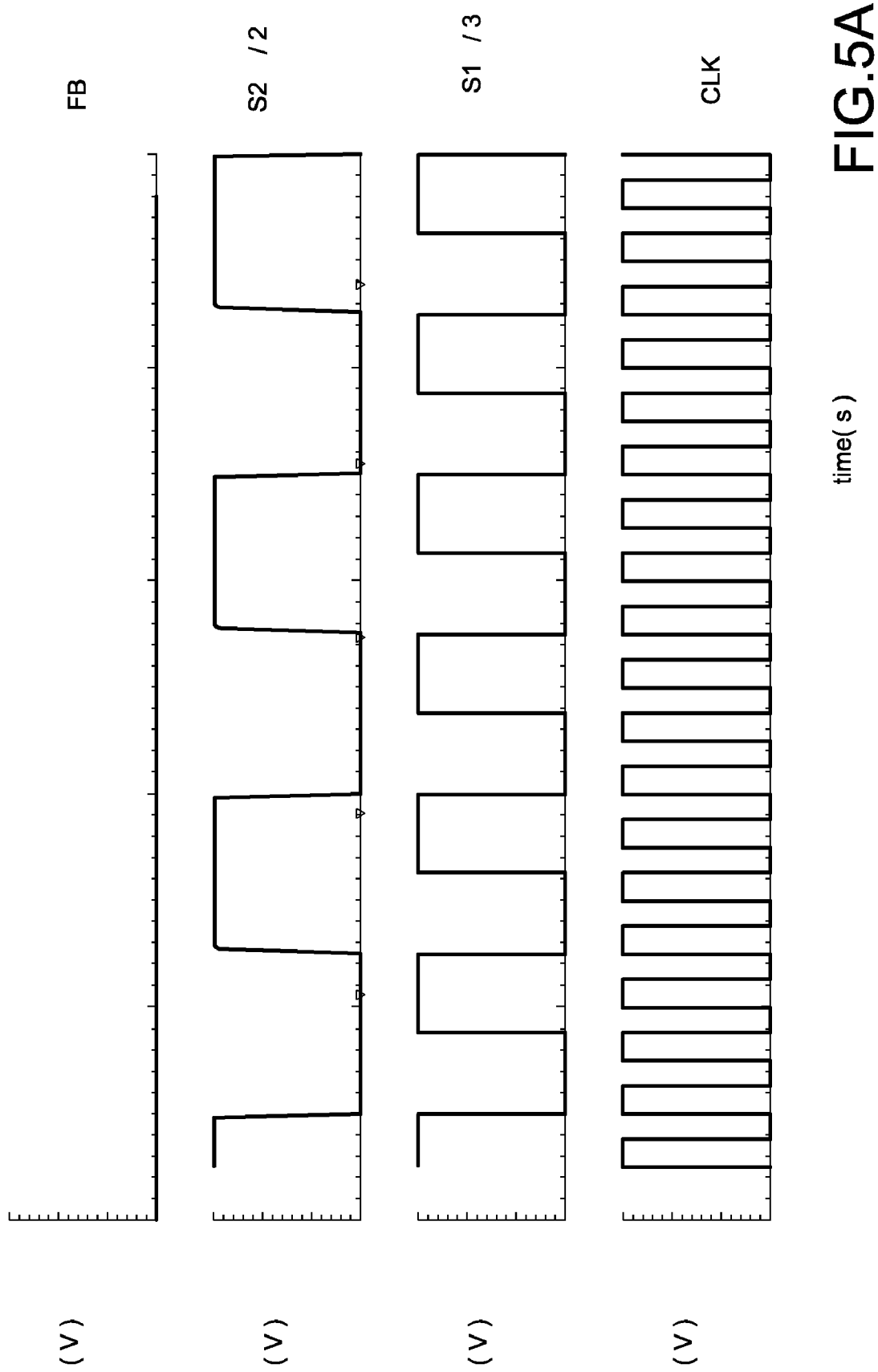
FIG. 5A to FIG. 5D are signal waveform charts of the programmable divider apparatus is applied to different divisors, such as 6, 7, 10, and 11, respectively.

Please refer to FIG. 3A, 5A, and Table 3, the feedback control unit 140 outputs a fixed value and the output of the second divider 120 does not feed back to the first frequency division unit 100 because the frequency division operation of division by 6 does not involve a feedback operation. The fixed value is outputted by the first selection control signal (SEL_2_3_4) to control the first divider 100 to provide a frequency division operation of division by 3, and the second selection control signal (Div_2) is set as logic 1 to control the second divider 120 to provide a frequency division operation of division by 2. Hence, the frequency division operation of division by 6 (3+3) is implemented.

Figure 5B:
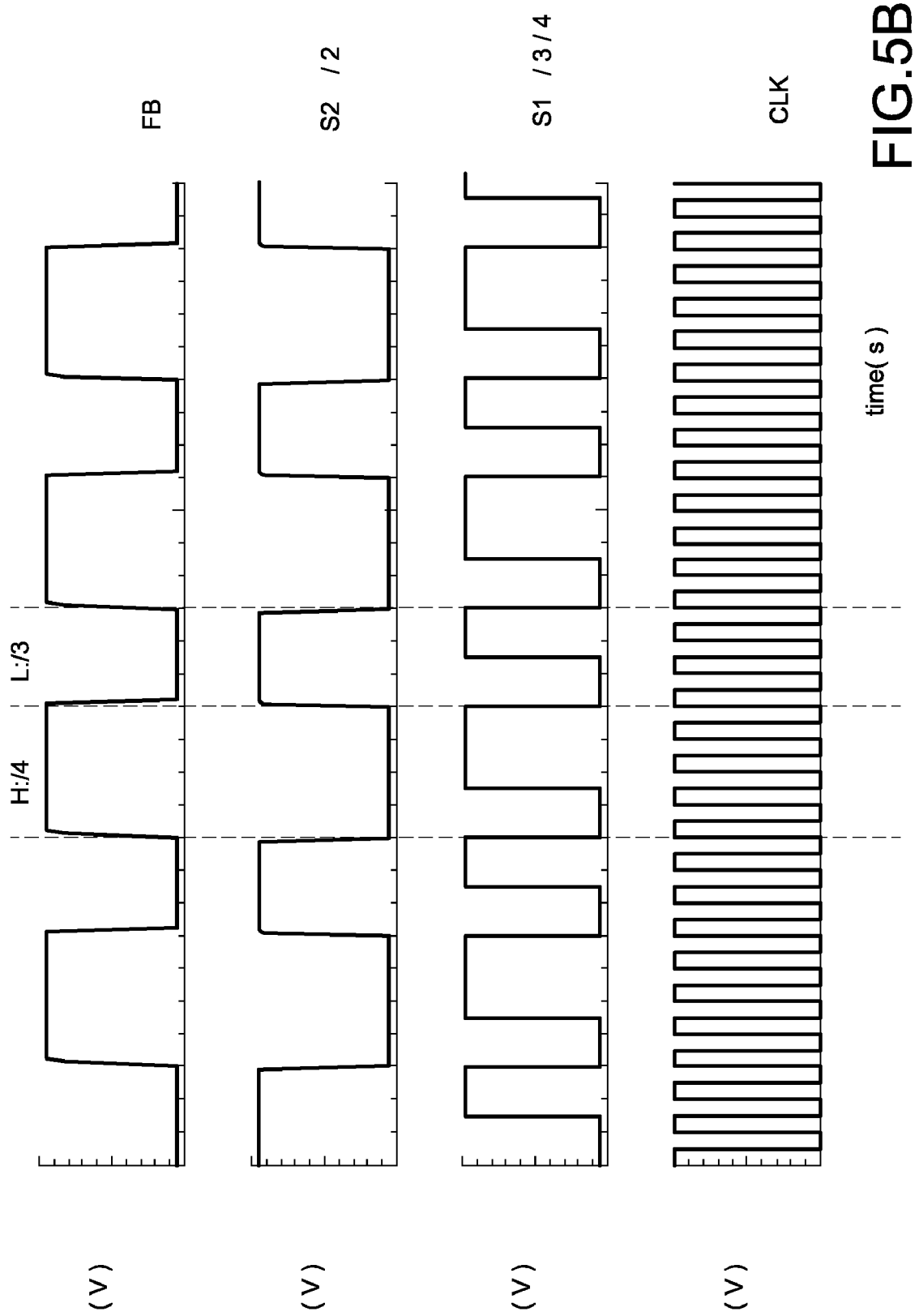

Please refer to FIGS. 3A, 5B, and Table 3, the feedback control unit 140 uses the feedback control signal (Div_0) and the feedback control signal (Div_1) to select the output of the second divider 120 to feed back to the first divider 100 because the frequency division operation of division by 7 involves a feedback operation. The first selection control signal (SEL_2_3_4) is set as logic 0 and the logic level of the feedback output signal (FB) is used to select the frequency division operation of division by 3 or division by 4. In addition, the second selection control signal (Div_2) is set as logic 1 to control the second divider 120 to provide a frequency division operation of division by 2. Because the second divider 120 provides the frequency division operation of division by 2 and the first divider 100 provides the frequency division operation of division by 3 or division by 4 according to the feedback output signal (FB), the frequency division operation of division by 7 (3+4) is implemented.

Figure 5C:
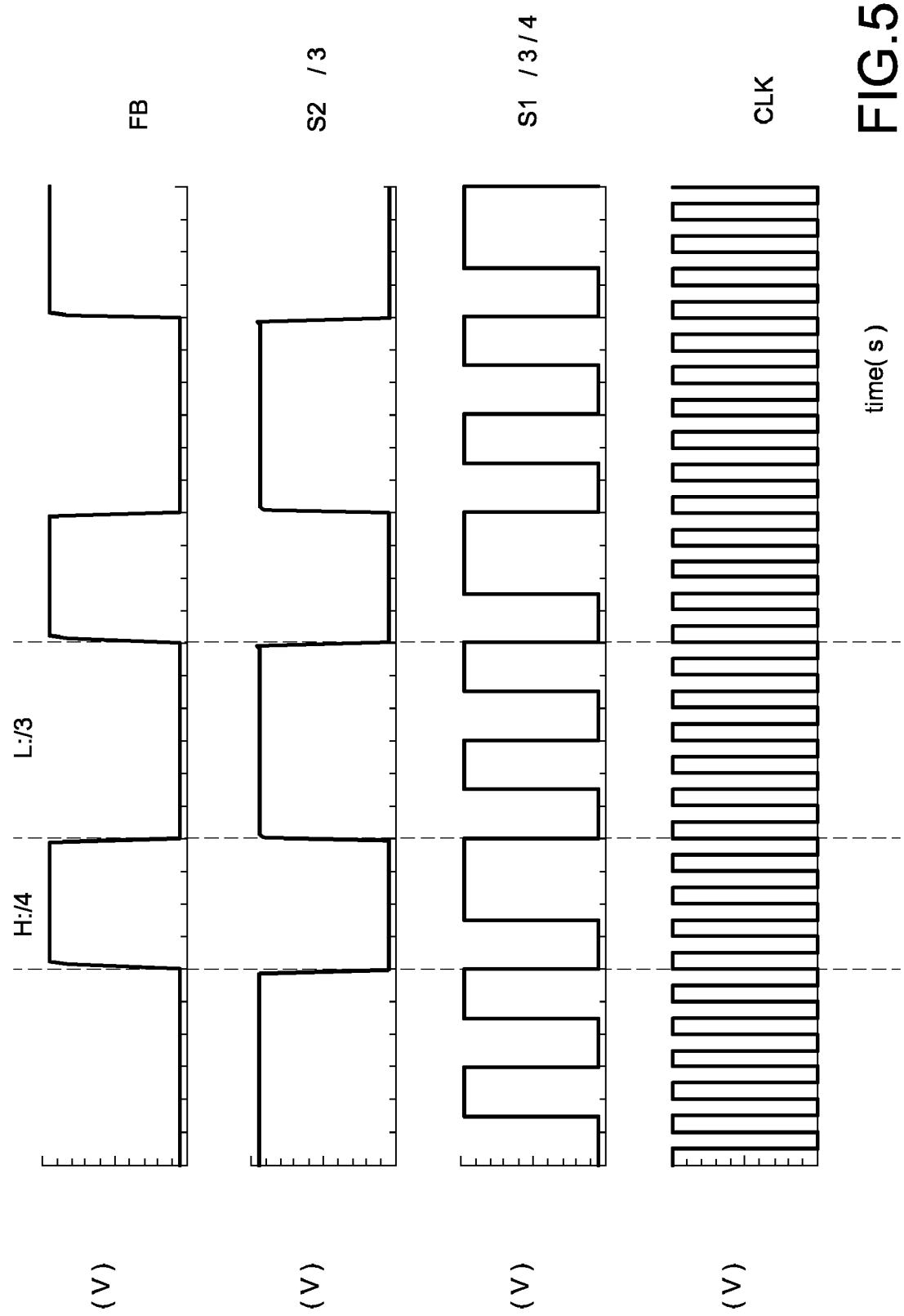

Please refer to FIGS. 3A, 5C, and Table 3, the feedback control unit 140 uses the feedback control signal (Div_0) and the feedback control signal (Div_1) to select the output of the second divider 120 to feed back to the first divider 100 because the frequency division operation of division by 10 is concerned with a feedback operation. The first selection control signal (SEL_2_3_4) is set as logic 0 and the logic level of the feedback output signal (FB) is used to select the frequency division operation of division by 3 or division by 4. In addition, the second selection control signal (Div_2) is set as logic 0 to control the second divider 120 to provide a frequency division operation of divided by 3. Because the second divider 120 provides the frequency division operation of divided by 3 and the first divider 100 provides the frequency division operation of divided by 3, divided by 3, and divided by 4 sequentially when the feedback output signal (FB) is logic 0, logic 0, and logic 1 sequentially, the frequency division operation of division by 10 (3+3+4) is implemented.

Figure 5D:
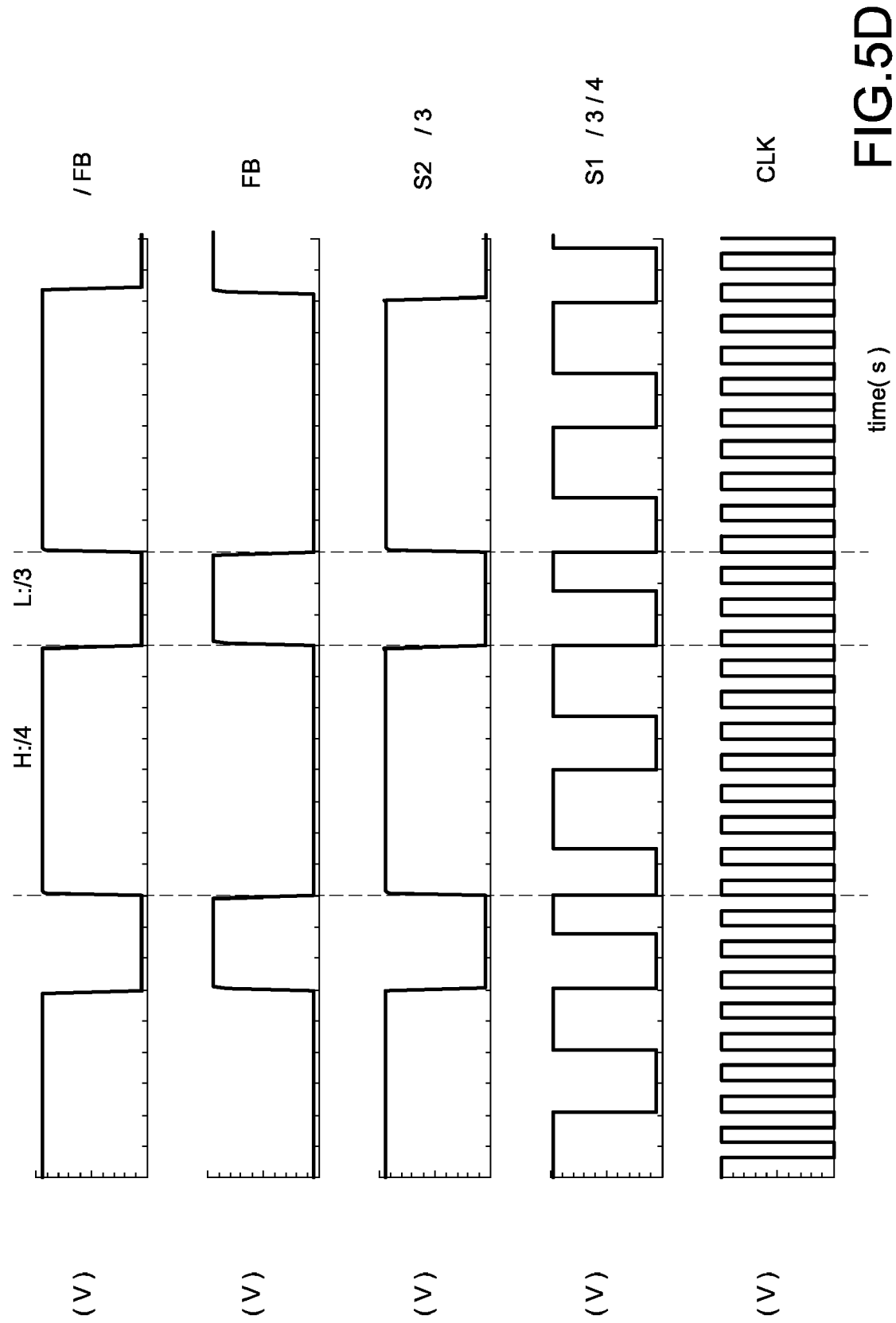

Please refer to FIGS. 3A, 5D, and Table 3, the feedback control unit 140 uses the feedback control signal (Div_0) and the feedback control signal (Div_1) to select the output of the second divider 120, and the output is inverted by the feedback inversion control signal (FB_inv) to feed back to the first divider 100 because a feedback operation is involved in the frequency division operation of division by 11. The first selection control signal (SEL_2_3_4) is set as logic 0 and the logic level of the feedback inversion control signal (FB_inv) is used to select the frequency division operation of division by 3 or division by 4. In addition, the second selection control signal (Div_2) is set as logic 0 to control the second divider 120 to provide a frequency division operation of division by 3. Because the second divider 120 provides the frequency division operation of division by 3 and the output is inverted by the feedback inversion control signal (FB_inv), and the first divider 100 provides the frequency division operation of division by 4, division by 4, and division by 3 sequentially when the feedback output signal (FB) is logic 1, logic 1, and logic 0 sequentially, the frequency division operation of division by 11 (4+4+3) is implemented.

According to the above-mentioned four examples, the programmable divider apparatus can receive an input signal to execute a frequency division operation of division by 4, 5, . . . , and 12.

Figure 6:
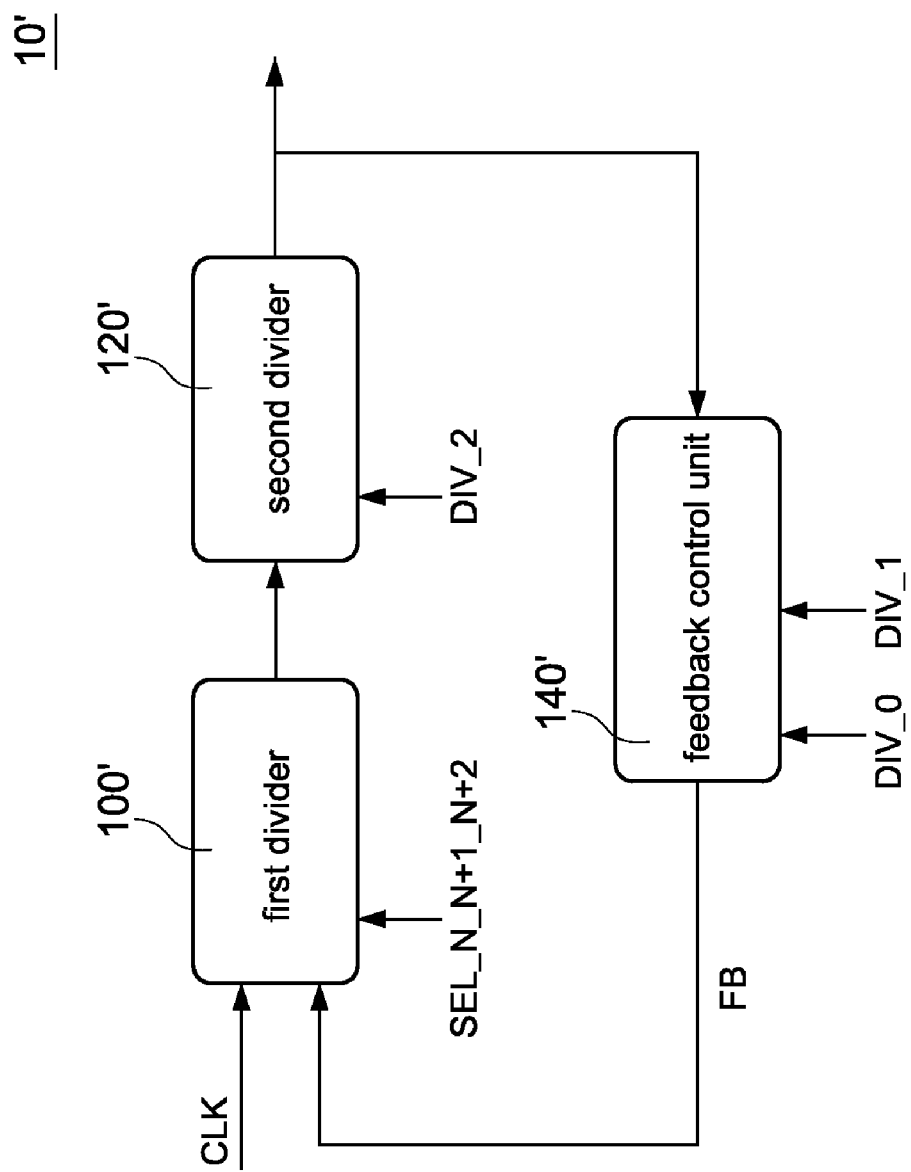
FIG. 6 is a schematic view of another preferred embodiment of the present invention.

Reference is made to FIG. 6 which is a schematic view of another preferred embodiment of the present invention. The programmable divider apparatus 10' comprises a first divider 100', a second divider 120', and a feedback control unit 140'. The second divider 120' is cascaded to the first divider 100'. The second divider 120' and the feedback control unit 140' are identical to the second divider 120 and the feedback control unit 140 shown in the FIG. 3A, separately. The first divider 100' can provide a frequency division operation of division by three consecutive integers (N, N+1, and N+2) and the three consecutive integers used is controlled by the first selection control signal (SEL_N_N+1_N+2). The preferred embodiment shown in FIG. 3A is a special case of the preferred embodiment shown in FIG. 6 when the N equals 2.

The programmable divider apparatus 10' can provide a frequency division operation of division by 2N to (3N+6). More particularly, the programmable divider apparatus 10' can provide a frequency division operation of division by 2 to 12 when the N equals 2, and a frequency division operation of division by 6 to 15 when the N equals 3.

Figure 7:
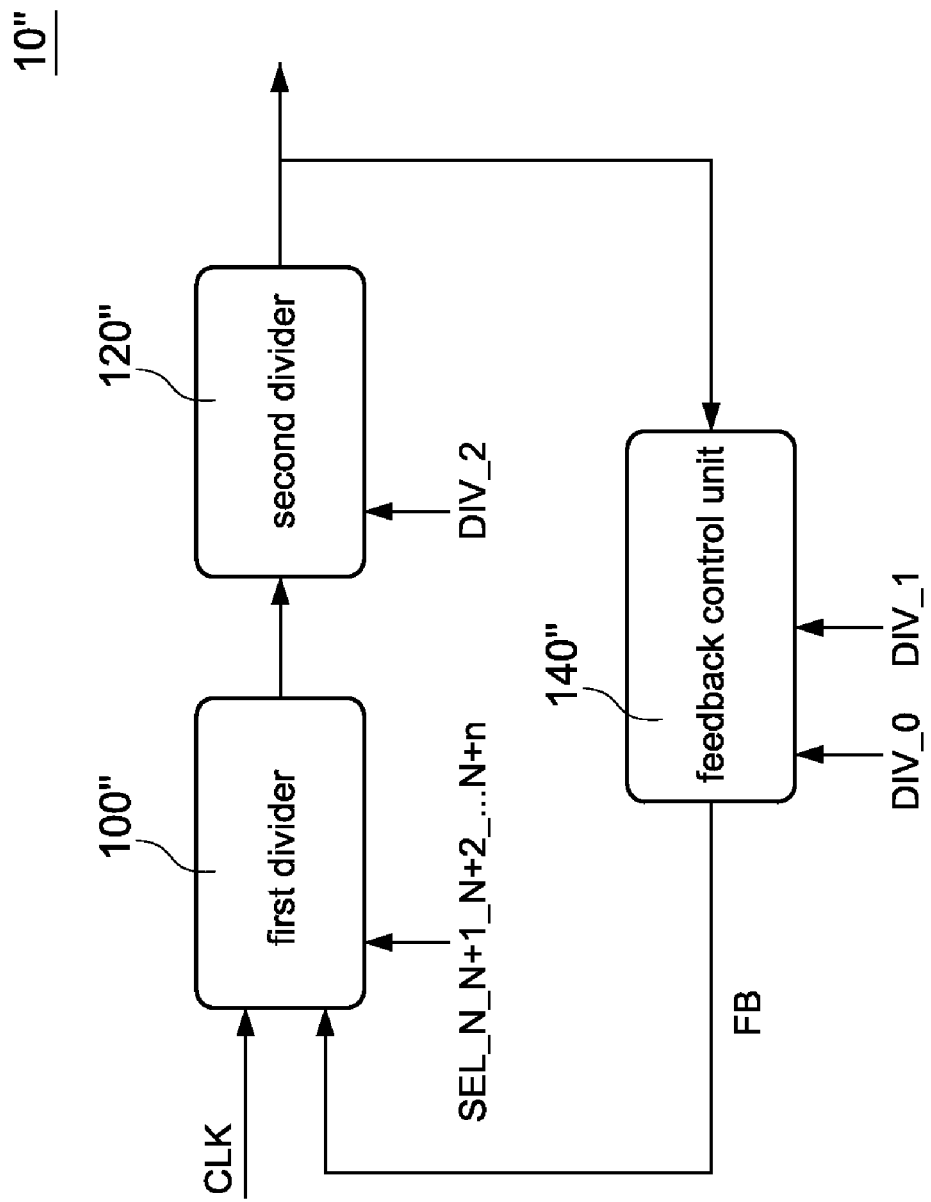
FIG. 7 is a schematic view of another preferred embodiment of the present invention.

Reference is made to FIG. 7 which is a schematic view of another preferred embodiment of the present invention. The programmable divider apparatus 10" comprises a first divider 100", a second divider 120", and a feedback control unit 140".

The second divider 120" is cascaded to the first divider 100". The second divider 120" and the feedback control unit 140" are identical to the second divider 120 and the feedback control unit 140 shown in the FIG. 3A, separately. The first divider 100" can provide a frequency division operation of division by (n+1) consecutive integers (N, N+1, N+2, . . . , N+n) and the (n+1) consecutive integers are controlled by the first selection control signal (SEL_N+1_N+2. . . N+n). The preferred embodiment shown in FIG. 3A is a special case of the preferred embodiment shown in FIG. 7 when the N equals 2 and the n equals 2.

The programmable divider apparatus 10' can provide a frequency division operation of division by 2N to (3N+3n). More particularly, the programmable divider apparatus 10' can provide a frequency division operation of division by 4 to 12 when the N equals 2 and the n equals 2, and a frequency division operation of division by 4 to 15 when the N equals 2 and the n equals 3.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A programmable divider apparatus receiving an input signal to execute a frequency division operation for the input signal, the programmable divider apparatus comprises:
    a first divider providing a frequency division operation of division by at least three predetermined integers;
    a second divider providing a frequency division operation of division by two integers m and n, and cascading to the first divider;
    a feedback control unit coupled to between an output of the second divider and an input of the first divider; and
    a plurality of control signals comprising:
        a first selection control signal controlling the first divider to execute a frequency division operation of division by a specific integer in the at least three predetermined integers;
        a second selection control signal controlling the second divider to execute a frequency division operation of division by m and n; and
        at least a feedback control signal controlling the feedback control unit to provide the output or inverted output of the second divider to the input of the first divider, or to provide a logic 1 or logic 0 level.

2. The frequency division apparatus in claim 1, wherein m is 2 and n is 3.

3. A programmable frequency division method receiving an input signal to execute a frequency division operation for the input signal, the method comprising the steps of:
    providing a first divider to provide a frequency division operation of division by at least three predetermined integers; and providing a second divider to provide a frequency division operation of division by two integers m and n, and cascading to the first divider;
    providing a feedback control unit coupled to between an output of the second divider and an input of the first divider; and
    controlling the first divider to execute a frequency division operation of division by a specific integer in the three predetermined integers;
    controlling the second divider to execute a frequency division operation of division by m and n; and
    controlling the feedback control unit to provide the output or inverted output of the second divider to the input of the first divider, or to provide a logic 1 or logic 0 level.

4. The programmable frequency division method in claim 3, further comprising:
    providing a multiplexer coupled to the second divider, and the multiplexer provides the output or inverted output of the second divider to the input of the first divider according to the feedback control signal, or provides a logic 1 or logic 0 level.

5. The frequency division apparatus in claim 1, wherein the three predetermined integers are three consecutive integers.

6. The frequency division apparatus in claim 5, wherein the three consecutive integers are expressed as N, N+1 and N+2, wherein N is integer greater than or equal to 2.

7. The frequency division apparatus in claim 6, wherein N is 2.

8. The frequency division apparatus in claim 1, wherein the first divider includes:
    a first flip flop receiving the input signal;
    a first logic portion with an input thereof coupled to an output of the first flip flop;
    a second logic portion with an input thereof coupled to an output of the first logic portion;
    a second flip flop with an input thereof coupled to an output of the second logic portion, and an output of the second flip flop coupled to another input of the first flip flop and selectively connecting to another input of the second logic portion, respectively;
    a first control signal connecting to another input of the first logic portion; and
    a second control signal selectively inputting a fixed-level signal to the input of the second logic portion; or feeding back the output of the second flip flop to the input of the second logic portion;
    wherein the first control signal and the second control signal are utilized to execute a programmable frequency division operation of division by at least three predetermined integers.

9. The frequency division apparatus in claim 8, wherein the first divider further includes:
    a third logic portion having two input ends and an output end, and one of the input ends coupled to the output of the second flip flop and the output end coupled to the another input of the second logic portion; and
    a fourth logic portion having an input end coupled to the second control signal, and an output end coupled to the other input end of the third logic portion;
    wherein the third logic portion and the fourth logic portion processing the second control signal to input a fixed-level signal to the input of the second logic portion or feeding back the output of the second flip flop to the input of the second logic portion.

10. The frequency division apparatus in claim 3, wherein the three predetermined integers are three consecutive integers.

11. The frequency division apparatus in claim 10, wherein the three consecutive integers are expressed as N, N+1 and N+2, wherein N is integer greater than or equal to 2.

12. The frequency division apparatus in claim 11, wherein N is 2.

13. The frequency division method in claim 3, wherein the first divider includes:

a first flip flop receiving the input signal;

a first logic portion with an input thereof coupled to an output of the first flip flop;

a second logic portion with an input thereof coupled to an output of the first logic portion;

a second flip flop with an input thereof coupled to an output of the second logic portion, and an output of the second flip flop coupled to another input of the first flip flop and selectively connecting to another input of the second logic portion, respectively;

a first control signal connecting to another input of the first logic portion; and a second control signal selectively inputting a fixed-level signal to the input of the second logic portion; or feeding back the output of the second flip flop to the input of the second logic portion;

wherein the first control signal and the second control signal are utilized to execute a programmable frequency division operation of division by at least three predetermined integers.

14. The frequency division method in claim 13, wherein the first divider further includes:

a third logic portion having two input ends and an output end, and one of the input ends coupled to the output of the second flip flop and the output end coupled to the another input of the second logic portion; and a fourth logic portion having an input end coupled to the second control signal, and an output end coupled to the other input end of the third logic portion;

wherein the third logic portion and the fourth logic portion processing the second control signal to input a fixed-level signal to the input of the second logic portion or feeding back the output of the second flip flop to the input of the second logic portion.

\* \* \* \* \*